United States Patent
Minzoni

(10) Patent No.: US 7,109,773 B2
(45) Date of Patent: Sep. 19, 2006

(54) FLEXIBLE BLENDER

(75) Inventor: Alessandro Minzoni, Morrisville, NC (US)

(73) Assignee: Infineon Technologies AG, Munich (DE)

(*) Notice: Subject to any disclaimer, the term of this patent is extended or adjusted under 35 U.S.C. 154(b) by 40 days.

(21) Appl. No.: 10/957,803

(22) Filed: Oct. 4, 2004

(65) Prior Publication Data

US 2006/0071699 A1    Apr. 6, 2006

(51) Int. Cl.
*H03K 17/92*    (2006.01)

(52) U.S. Cl. .................. 327/269; 327/355

(58) Field of Classification Search ........ 327/233–235, 327/270, 271, 269, 254–257, 355–357, 360–361
See application file for complete search history.

(56) References Cited

U.S. PATENT DOCUMENTS

| | | | |
|---|---|---|---|
| 6,137,327 A | 10/2000 | Schnell | 327/158 |
| 6,337,834 B1 | 1/2002 | Isobe et al. | 365/233 |
| 6,617,909 B1 | 9/2003 | Shim | 327/355 |
| 6,680,635 B1* | 1/2004 | Lee | 327/158 |
| 6,696,872 B1 | 2/2004 | Le et al. | 327/158 |
| 6,774,691 B1 | 8/2004 | Han et al. | 327/158 |
| 6,774,693 B1 | 8/2004 | Carr | 327/276 |
| 6,791,376 B1* | 9/2004 | Vangal | 327/99 |

* cited by examiner

*Primary Examiner*—Linh My Nguyen
(74) *Attorney, Agent, or Firm*—Dicke, Billig & Czaja, PLLC

(57) ABSTRACT

A blender circuit configured to receive a first signal having a first signal phase and a second signal having a second signal phase. The first and second signals have a similar frequency and the first and second signal phases are separated by a time delay. The blender circuit includes a first, second and third circuits. The first circuit is configured to receive the first signal and to generate a plurality of first intermediate signals that are independent of the time delay between the first and second signals. The second circuit is configured to receive the second signal and to generate a plurality of second intermediate signals that are independent of the time delay between the first and second signals. The third circuit is configured to receive the first plurality and second plurality of intermediate signals and to generate plurality of out signals. Each of the plurality of out signals have different signal phases that are spaced in time relative to each other. Each signal phase of the plurality of out signals falls within the time delay. The number of out signals generated within the time delay varies dependant upon the length of the time delay.

20 Claims, 6 Drawing Sheets

FLEXIBLE BLENDER

BACKGROUND

The present invention relates to deriving a fixed delay between multiple clock signals, in particular, to delay locked loop (DLL) circuits.

High speed electronic systems often have critical timing requirements that call for a periodic clock signal having a precise timing relationship with some reference signal. Many high performance integrated circuits present challenges in keeping such integrated circuits synchronized during operation.

The operation of these complex systems require that the components be highly synchronized. In this way, the maximum skew or difference in time between the significant edges of the internal clocking signals of all the components should be minimal. Different components may have different manufacturing parameters. In addition, other factors such as ambient temperature, voltage, and processing variation can lead to large difference in the phases of the internal clocking signals of the different components. Consequently, feeding a system-wide reference clock to the components may not be sufficient to achieve synchronization.

One way synchronization has been achieved is with the use of delay locked loop (DLL) circuits. A DLL typically includes a phase detector that detects the phase difference between an input clock and an output clock signal of the same frequency and generates a digital signal related to the phase difference. The phase difference signal is then in turn used by a delay control block to control a delay chain. A delay chain accordingly advances or delays the timing of the output clock signal with respect to the input clock signal until the rising edge of the output clock signal is coincident with the rising edge of the input clock signal. The phase detector control block and delay chain thus operate in a closed loop to bring the two clock signals into phase and thus synchronize the component whose operations are timed in accordance with the respective clock signals.

In a DLL feedback loop, on-chip delay is often modeled. The modeled delay approximates the actual delay caused by a semiconductor device's circuit components, such as: receiver, a driver, and an off chip driver (OCD), as well as that caused by external termination and load. A delay model often utilizes an inverter chain to account for delay.

Some such DLL feedback loop designs suffer from inaccurate modeling of the actual delay caused by the circuit components. Some such inaccuracies result from variations in technology and unaccounted for temperate effects. Furthermore, some designs are difficult to implement in some systems.

For these and other reasons the need exits for the present invention.

SUMMARY

The present invention is a blender circuit. The circuit is configured to receive a first signal having a first signal phase and a second signal having a second signal phase. The first and second signals have a similar frequency and the first and second signal phases are separated by a time delay. The blender circuit includes a first, second and third circuits. The first circuit is configured to receive the first signal and to generate a plurality of first intermediate signals that are independent of the time delay between the first and second signals. The second circuit is configured to receive the second signal and to generate a plurality of second intermediate signals that are independent of the time delay between the first and second signals. The third circuit is configured to receive the first plurality and second plurality of intermediate signals and to generate plurality of out signals. Each of the plurality of out signals have different signal phases that are spaced in time relative to each other. Each signal phase of the plurality of out signals falls within the time delay. The number of out signals generated within the time delay varies dependant upon the length of the time delay.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 2:
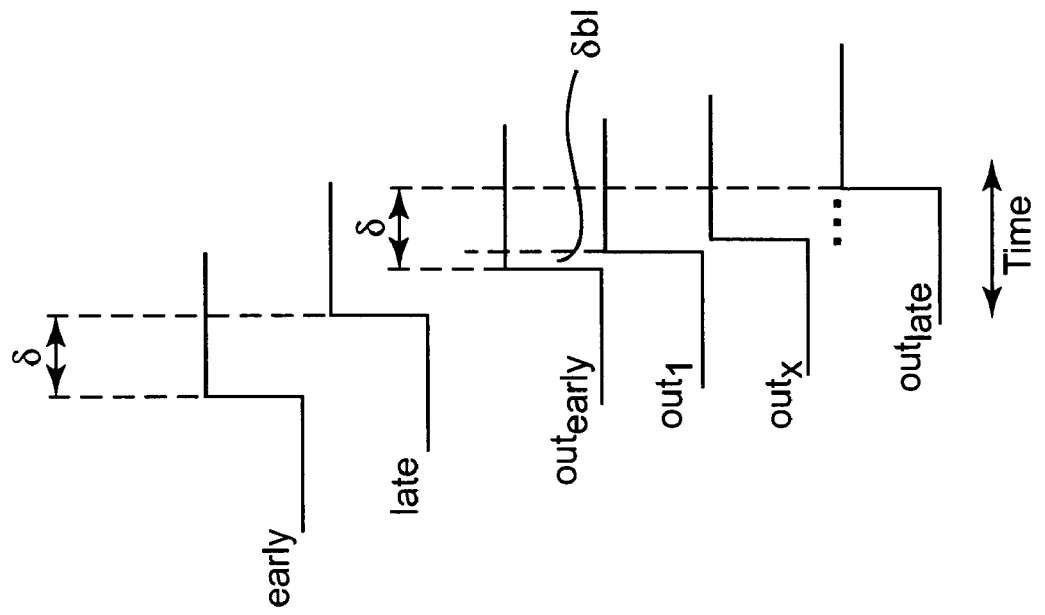
FIG. 2 illustrates timing diagrams of the blender circuit of FIG. 1.
Figure 1:
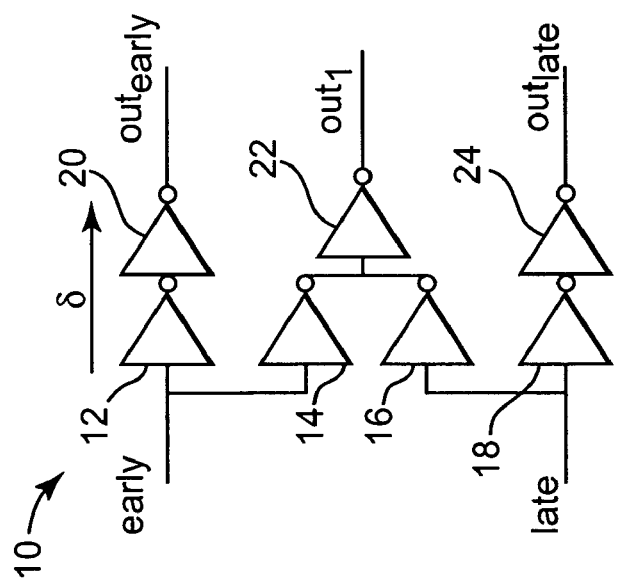
FIG. 1 illustrates a block diagram of a blender circuit.

FIG. 1 illustrates blender circuit 10 and FIG. 2 illustrates the timing signals associated with circuit 10. As illustrated in FIG. 2, circuit 10 receives early and late signals, each having an associated signal phase. Early and late signals are of approximately the same frequency, but the late signal phase is delayed relative to the early signal phase. The delay between the early and late signal phases is defined as $\delta$, as illustrated in FIG. 2, and can be referred to as a coarse delay.

Circuit 10 includes inverters 12, 14, 16, 18, 20, 22 and 24, all of which include an input and an output. The early signal is coupled to the input of inverters 12 and 14. The output of inverter 12 is coupled to inverter 20. Inverter 20 produces an $out_{early}$ signal. The late signal is coupled to the input of inverters 16 and 18. The output of inverter 18 is coupled to the input of inverter 24. Inverter 24 produces an $out_{late}$ signal. The outputs of inverters 14 and 16 are coupled to the input of inverter 22. Inverter 22 produces an $out_1$ signal.

Each of inverters 12–24 introduce delay to the input clock signals (early and late signals). As illustrated in FIG. 2, the phase of $out_{early}$ clock signal that is produced by inverter 20 is delayed relative to the phase of the early signal that is introduced to the input of inverter 12. This delay between the early signal and the $out_{early}$ signal is caused by the propagation delays of signals through inverters 12 and 20. Similarly, the phase of $out_{late}$ signal that is produced by inverter 24 is delayed relative to the phase of the late signal that is introduced to inverter 18. This delay between the phases of the late signal and the $out_{late}$ signal is caused by the propagation delays of signals through inverters 18 and 24. The difference or delay $\delta$ between the early and late signal, however, is maintained between the $out_{early}$ and $out_{late}$ signal because inverters 12 and 20 are designed to generate the same delay as do inverters 18 and 24.

Inverters 14, 16, and 22 help produce a blended signal $out_1$ between $out_{early}$ and $out_{late}$. As illustrated in FIG. 2, $out_1$ signal is delayed relative to $out_{early}$, but is advanced relative to $out_{late}$. $\delta_{b1}$ represents the amount of delay that $out_1$ signal is delayed relative to $out_{early}$ signal. This delay $\delta_{b1}$ may be referred to as fine delay within the coarse delay. Additional blending circuits similar to a blender circuit formed by inverters 14, 16, and 22 may be designed to generate additional out signals between $out_{early}$ and $out_{late}$. Signal $out_x$ represents one such signal.

The additional fine delays of various blended clock signals $out_1$ and $out_x$ may be used in association with a DLL feedback loop in order to accurately align the phase of clocks with clock signals that have been delayed due to a semiconductor device's circuit components. This facilitates improved synchronization.

Although circuit 10 provides various advantages in synchronization, its ability to produce delay signals is dependent on the size of the buffers or inverters 10–24 that are used. It is also sensitive to voltage or temperature change that can skew clock signals and degrade overall accuracy of the system. In addition, the resolution of circuit 10 is not easily adjustable. For example, in one embodiment circuit 10 may produce five fine delay signals in response to a coarse delay between the phases of the early and late signals. Where the coarse delay is fairly small, five intermediate steps between the early and late signals may be sufficient. If the coarse delay is fairly large, however, the five intermediate steps between the early and late signals may be not be sufficient and circuit 10 may need to be adjusted to provide more fine resolution. Obviously, custom adjustments of circuit 10 to account for variations in coarse delay are not desirable in many applications.

Figure 3:
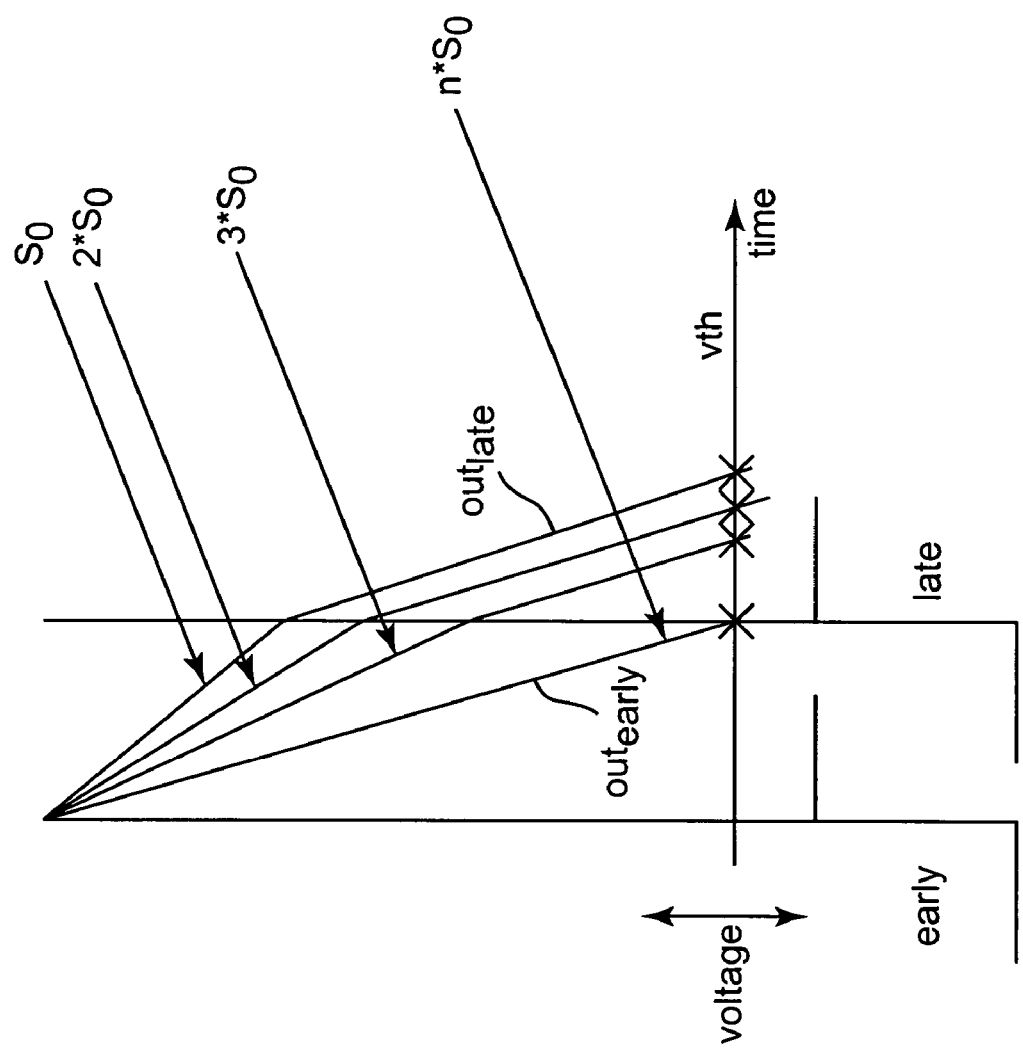
FIG. 3 illustrates timing diagrams of an alternative blender circuit.

FIG. 3 illustrates clock signals from an alternative blender circuit utilizing a capacitor and a current source. As with blender circuit 10 described with respect to FIGS. 1 and 2, a blender circuit whose signals are illustrated in FIG. 3 receives an early and a late signal, thereby defining a coarse delay $\delta$ between them. The blender circuit then generates intermediate clock signals within the coarse delay that can be used as fine delay signals.

In the blender circuit illustrated by the signals in FIG. 3, a maximum current is set that will discharge a capacitor at the fastest rate of time possible for that circuit. In the illustrated example, $n*S_0$ is the maximum current. Using this maximum current, $n*S_0$, the capacitor will discharge at its fastest rate. This fastest discharge then represents the $out_{early}$ signal.

The smallest increments of current for this blender circuit are $S_0$. Thus, when the current of the current source is equal to $S_0$ the capacitor will discharge at its slowest rate. This slowest discharge rate then represents the $out_{late}$ signal. Each increment of $S_0$ between $S_0$ and $n*S_0$ changes the current of the current source and therefore the discharge time. $2*S_0$ and $3*S_0$ are illustrated in FIG. 3. By changing the increments of $S_0$, the various blended signals are created. These increments are the fine delays within the coarse delay.

Such a blender circuit can be constructed to provide various blended, or fine, delay signals between $out_{early}$ and $out_{late}$, or coarse delay signals. Such circuits, however, are very difficult to design and require significant design effort. In addition, such circuits may not remain stable through different steps. Also, such circuits are sensitive to process changes and thereby suffer in accuracy in some instances. In addition, such a circuit may also need to be adjusted where the coarse delay is fairly large such that the intermediate steps between the early and late signals are not sufficient to provide adequate fine resolution.

Figure 4:
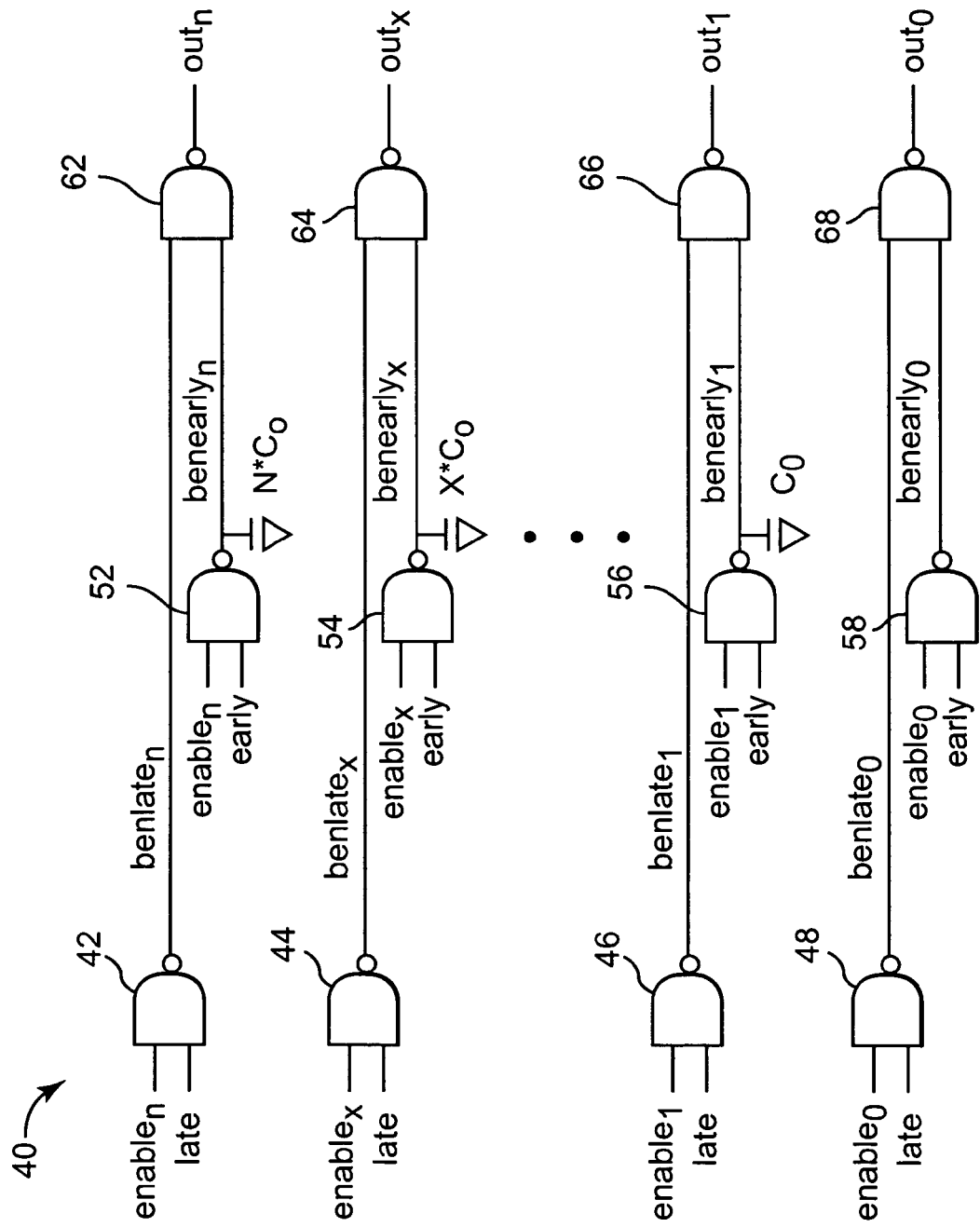
FIG. 4 illustrates an exemplary embodiment of a blender circuit in accordance with the present invention.

FIG. 4 illustrates blender circuit 40 in accordance with the present invention. Blender circuit 40 includes NAND gates 42, 44, 46, 48, 52, 54, 56, 58, 62, 64, 66 and 68. As with previously described blender circuits, early and late signals are received by blender circuit 40. Early and late signals are of approximately the same frequency, but the late signal phase is delayed relative to the early signal phase. Again, the phase delay between the early and late signals is defined as $\delta$, and can be referred to as a coarse delay.

Blender circuit 40 then generates output signals $out_0$, $out_1$, and $out_x$, through $out_n$. These signals represent fine delay signals within the coarse delay. Unlike the prior described blender circuits, however, blender circuit 40 in accordance with the present invention develops a sequence of clock signals that are completely independent from the coarse delay $\delta$ between the between early and late signals. Blender circuit 40 automatically chooses only those signals that are generated within the coarse delay $\delta$ between early and late signals and ignores any delay signals generated outside the coarse delay.

Blender circuit 40 includes a first logic circuit including NAND gates 42, 44, 46, and 48. Blender circuit 40 further includes a second logic circuit, including NAND gates 52, 54, 56, and 58. Blender circuit 40 also includes a third logic circuit, including NAND gates 62, 64, 66, and 68. The total number of NAND gates within each of these logic circuits may be varied in accordance with the present invention. For example, each logic circuit could have the illustrated four NAND gates thereby producing a total of four output signals ($out_0$, $out_1$, $out_x$, and $out_n$), or each logic circuit could have 10, 20, 30, or more or less NAND gates, thereby respectively producing 10, 20, 30 or more or less output signals. The total number of NAND gates in each logic circuit will determine the number of output delay signals that are generated.

Each NAND gate 42 through 48 in the first logic circuit receives the late signal. Each NAND gate 42 through 48 then also receives an enable signal associated with that particular NAND gate. For example, NAND gate 48 receives $enable_0$ signal, NAND gate 46 receives $enable_1$ signal, NAND 44 receives $enable_x$ signal, and NAND gate 42 receives $enable_n$ signal. In this way, any one of the NAND gates 42 through 48 may be selectively enabled by toggling the appropriate enable signal ($enable_0$ through $enable_n$).

Each NAND gate 52 through 58 in the second logic circuit receives the early signal. Each NAND gate 52 through 58 then also receives an enable signal associated with that particular NAND gate. For example, NAND gate 58 receives enable$_0$ signal, NAND gate 56 receives enable$_1$ signal, NAND 54 receives enable$_x$ signal, and NAND gate 52 receives enable$_n$ signal. As above with respect to NAND gates 42 through 48, any one of the NAND gates 52 through 58 may be selectively enabled by toggling the appropriate enable signal (enable$_0$ through enable$_n$).

Figure 5A:
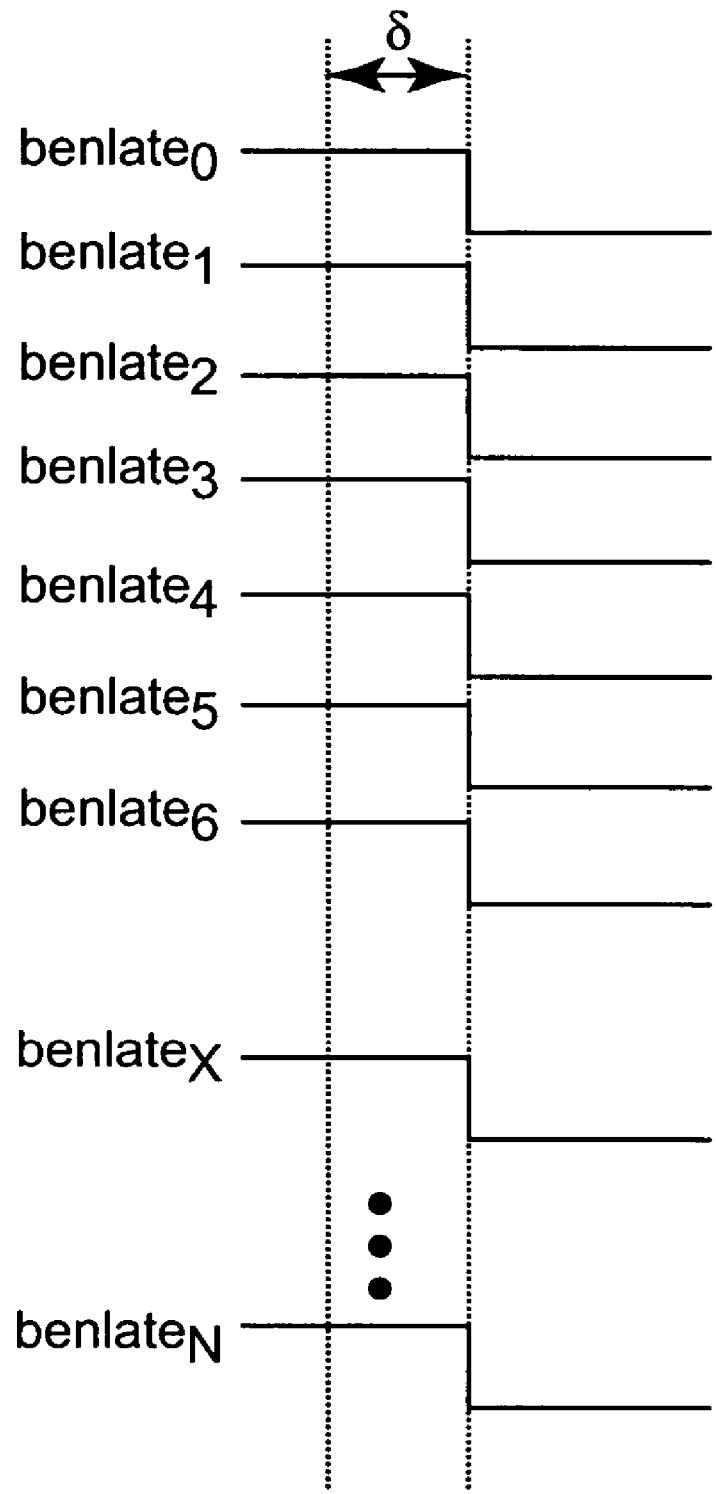
FIGS. 5A–5C illustrate timing diagrams of the exemplary embodiment of FIG. 4.

NAND gates 42 through 48 of the first logic circuit each produce a benlate signal, which is the complement (b) of the logic combination of the enable (en) signal of the corresponding NAND gate and the late (late) signal. In this way, NAND gate 48 produces benlate$_0$ signal, NAND gate 46 produces benlate$_1$ signal, NAND gate 44 produces benlate$_x$ signal, and NAND gate 42 produces benlate$_n$ signal. One example set of these signals is illustrated in FIG. 5A. When the particular NAND gate in the first logic circuit is enabled, the corresponding benlate signal will transition low when the late signal transitions high.

For example, for NAND gate 48, when enable$_0$ signal is a logic high (or enabled), the benlate$_0$ signal will transition low when the late signal transitions high. This signal is illustrated in FIG. 5A and labeled benlate$_0$. In the same way, for the other NAND gates 46, 44 and 42, when the respective enable signal for that gate is a logic high (or enabled), the respective benlate signal will transition low when the late signal transitions high. Additional benlate signals (benlate$_3$ through benlate$_6$) are also illustrated in FIG. 5A.

Figure 5B:
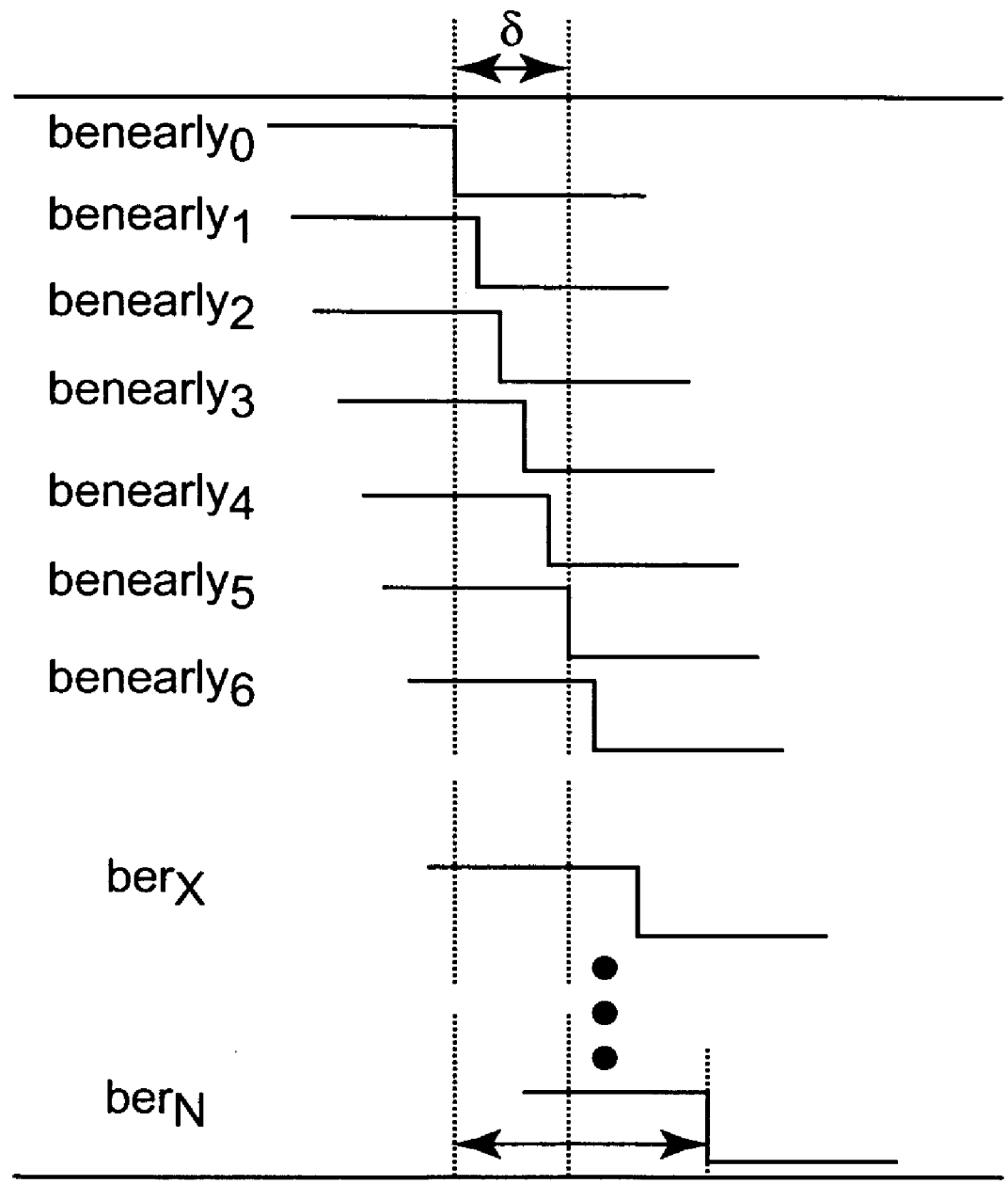

NAND gates 52 through 58 of the second logic circuit each produce a benearly signal, which is the complement (b) of the logic combination of the enable (en) signal of the corresponding NAND gate and the early (early) signal. In this way, NAND gate 58 produces benearly$_0$ signal, NAND gate 56 produces benearly$_1$ signal, NAND gate 54 produces benearly$_x$ signal, and NAND gate 52 produces benearly$_n$ signal. One example set of these signals is illustrated in FIG. 5B. When the particular NAND gate in the second logic circuit is enabled, the corresponding benearly signal will transition low when the early signal transitions high, or slightly after that point in time. The transition in the benearly signal is delayed in time in some cases by a capacitor coupled to the output of some of the NAND gates in the second logic circuit.

For example, for NAND gate 58, when enable$_0$ signal is a logic high (or enabled), the benearly$_0$ signal will transition low when the early signal transitions high. This signal is illustrated in FIG. 5B and labeled benearly$_0$. For NAND gate 56, when enable$_1$ signal is a logic high (enabled), benearly$_1$ transitions low slightly after the early signal transitions high. The amount of delay after the early signal transitions high to benearly$_1$ transitioning low is determined by the characteristics of capacitor $C_0$ coupled to the output of NAND gate 56. Similarly, benearly$_x$ transitions low after NAND gate 54 is enabled with enable$_x$ and the early signal transitions high as delayed by capacitor $x*C_0$. Also, benearly$_n$ transitions low after NAND gate 52 is enabled with enable$_n$ and the early signal transitions high as delayed by capacitor $n*C_0$.

As illustrated in FIG. 5B, each benearly signal is delayed an incremental amount past the previous benearly signal as determined by the value of the capacitor coupled to the output of the corresponding NAND gate. In this way, blender circuit 40 can produce any number of benearly signals that are delayed relative to the early signal. In one embodiment, blender circuit 40 is configured to produce a number of benearly signals that are each delayed by an identical amount $\delta_{b1}$ relative to each other. Additional benearly signals (benearly$_3$ through benearly$_6$ are also illustrated in FIG. 5B.

In each of FIGS. 5A and 5B, delay $\delta$ is designated. In each case, delay $\delta$ is the difference between benearley$_0$ signal and the benlate$_N$ signal. In the case of each of the benlate signals, all of them transition at the end edge of the delay $\delta$. In the case of each of the benearley signals, each will transition on or after the front edge of the delay $\delta$, and some will transition beyond the end edge of delay $\delta$.

Each of the benlate signals and benearly signals are fed into a corresponding NAND gate in the third logic circuit including NAND gates 62 through 68. FIG. 4 illustrates the third logic circuit including NAND gates 62 through 68. For example, benearly$_0$ and benlate$_0$ are received as inputs to NAND gate 68. NAND gate 68 correspondingly produces out$_0$ signal. Similarly, benearly$_1$ and benlate$_1$ are received as inputs to NAND gate 66, which correspondingly produces out$_1$ signal; benearly$_x$ and benlate$_x$ are received as inputs to NAND gate 64, which correspondingly produces out$_x$ signal; and benearly$_n$ and benlate$_n$ are received as inputs to NAND gate 62, which correspondingly produces out$_n$ signal. The various output signals out$_0$, out$_1$, out$_x$, through out$_n$ are illustrated in FIG. 5C.

Figure 5C:
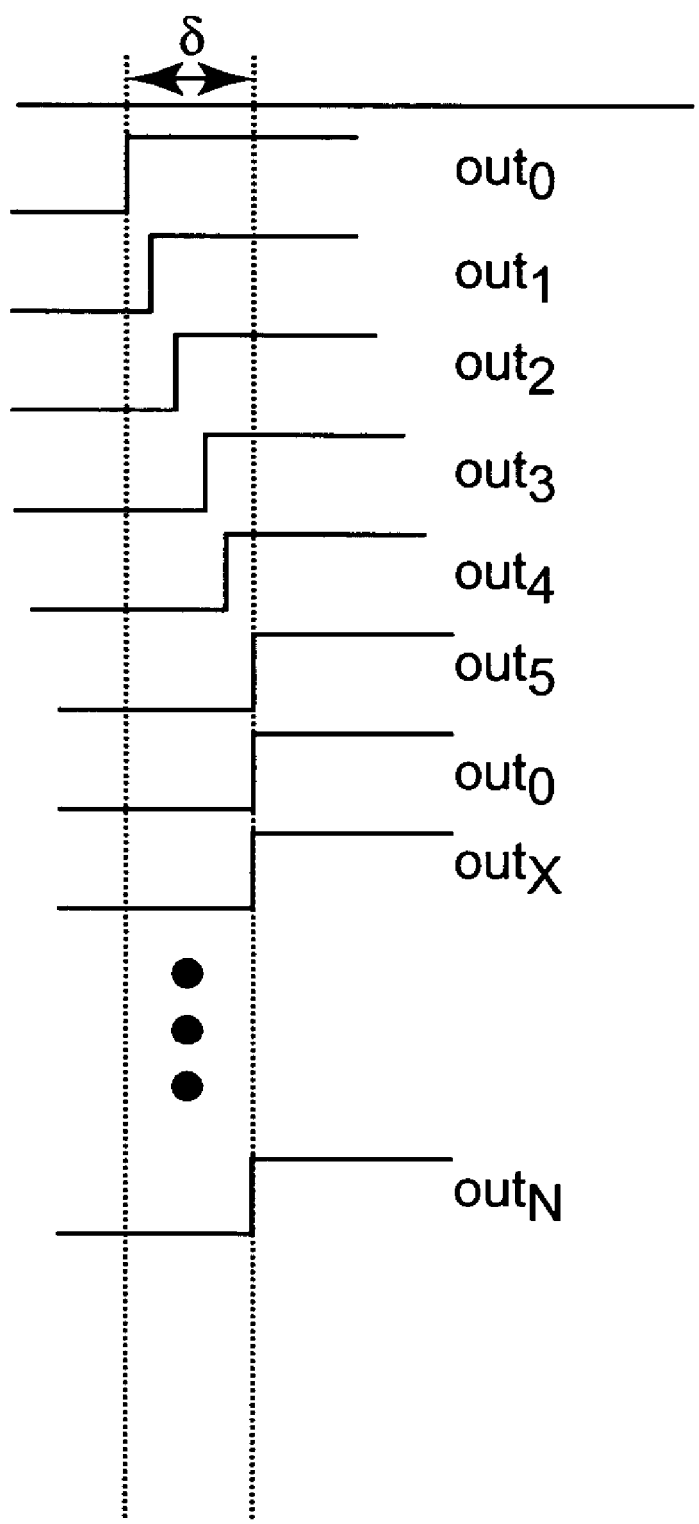

As illustrated in FIG. 5C, the out signal from each of the NAND gates in the third logic circuit is low when the input signals to the NAND gates benearly and benlate are each high. Since each of the benlate signals remains high throughout the entire time delay $\delta$, defined as the phase difference between the early and late signals, each benearly signal essentially dictate the transition of the out signals from low to high with in the time delay $\delta$. Once end of the time delay $\delta$ is reached, however, each of the benlate signals transitions low. Consequently, each of the benlate signals control the corresponding out signals at that time. Consequently, all out signals are high after the end of the time delay $\delta$ is reached.

In this way, blender circuit 40 may be configured to produce a large number of out signals that are each independent clock signals that are spaced apart in time and whose signal phases fall exclusively during the time delay $\delta$. In one embodiment, blender circuit 40 is configured to produce a number of out signals that are each delayed by an identical amount $\delta_{b1}$ relative to each other. This may be quite useful in particular DLL applications to synchronize timing. With blender circuit 40, out signals are never generated outside the time delay $\delta$, which is desired for many applications.

Unlike other blender circuits, blender circuit 40 may be configured to produce a large number of out signals that are each delayed by an identical amount $\delta_{b1}$ relative to each other and such that the amount of delay $\delta_{b1}$ relative to each other does not change with changes to the time delay $\delta$, defined as the phase difference between the early and late signals. In other words, the fine delay ($\delta_{b1}$) of the signals generated by blender circuit 40 does not change with changes in the coarse time delay ($\delta$) between the signal phases of the early and late signals received by blender circuit 40.

By designing blender circuit 40 with enough resolution, it can be extremely flexible in its application. For example, in one embodiment, each of the first, second and third logic circuits are configured with 20 NAND gates. In this exemplary case, each of the 20 NAND gates of the first logic circuit is configured to receive the late signal such that the first logic circuit thereby generates 20 benlate signals. Each of the 20 NAND gates of the second logic circuit is configured to receive the early signal such that the second logic circuit thereby generates 20 benearly signals. Finally, each of the NAND gates of the third logic circuit is configured to receive one corresponding benlate signal and one corresponding benearly signal such that the third logic circuit thereby generates 20 out signals.

Such an exemplary blender circuit 40 may be used in a first application where a coarse delay between the signal phases of the early and late signals is relatively small such that only five fine delay out signals, for example, are generated within the coarse delay. However, it may also be used, without design modification, in a second application where a coarse delay between the signal phases of the early and late signals is relatively large such that 20 fine delay out signals, for example, are generated within the coarse delay. In the first application, blender circuit 40 essentially ignores any clock signals generated outside the coarse delay. In the second example, all out clock signals are within the coarse delay and thus are used.

In this way, the number of out clock signals generated and used by blender circuit 40 varies based on the application, and specifically, based on the coarse delay between the signal phases of the early and late signals.

Some design modifications to blender circuit 40 are possible, while still maintaining consistent functioning with the present invention. For example, in FIG. 4, the first logic circuit is illustrated as having one NAND gate corresponding to one NAND gate in the second logic circuit for each corresponding enable signal. In this way, a single capacitor $C_0$–$C_N$ is illustrated as producing the appropriate delay for the particular corresponding enable signal. For example, capacitor $C_0$ produces the delay in the benearley$_1$ signal that corresponds to the enable$_1$ signal. In an alternative embodiment, a plurality of NAND gates, each having a capacitor coupled to its output, may be provided for each corresponding enable signal in the second logic circuit.

In this way, the combined effect of the plurality of capacitors cause the fine delay $\delta_{b1}$ for the corresponding enable signal. For example, single NAND gate 56 and single capacitor $C_0$ in FIG. 4 could be replaced with three NAND gates and three capacitors (one at each output of each NAND gate) that in sum produce a delay that is equal to the delay produced by capacitor $C_0$. In this case where a single NAND gate is replaced by a plurality of NAND gates in the second logic circuit, and equal number of NAND gates should be added to the corresponding portion of the first logic circuit so that the produced benearly and benlate signals maintain proper relative alignment. For example in FIG. 4, if single NAND gate 56 in the second logic circuit is replaced with three NAND gates (and three corresponding capacitors), then single NAND gate 46 of first logic circuit 46 must also be replaced by three NAND gates to maintain proper timing with the propagation delays through the logic devices. For these series NAND gates, each output is fed into one input of the next NAND gate in the series and the other input may simply be tied high.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, blender circuit 40 is described in an exemplary form using logic circuits that include multiple NAND gates. One skilled in the art can see that these NAND gates could be substituted for using other logic gates or other electronics that accomplish similar results. For example, as an alternative NOR gates may be used consistent with the present invention. This application is intended to cover any adaptations or variations of the specific embodiments discussed herein. Therefore, it is intended that this invention be limited only by the claims and the equivalents thereof.

What is claimed is:

1. A blender circuit configured to receive a first signal having a first signal phase and a second signal having a second signal phase, wherein the first and second signals have a similar frequency and the first and second signal phases are separated by a time delay, the blender circuit comprising:
   a first circuit configured to receive the first signal and to generate a plurality of first intermediate signals that are independent of the time delay between the first and second signals;
   a second circuit configured to receive the second signal and to generate a plurality of second intermediate signals that are independent of the time delay between the first and second signals; and
   a third circuit configured to receive the first plurality and second plurality of intermediate signals and to generate plurality of out signals, wherein each of the plurality of out signals have different signal phases that are spaced in time relative to each other, wherein each signal phase of the plurality of out signals falls within the time delay, and wherein the number of out signals generated within the time delay varies dependant upon the length of the time delay.

2. The blender circuit of claim 1 wherein the first signal is an early signal, the second signal is a late signal, and the difference between the first and second signal phases is a coarse delay.

3. The blender circuit of claim 1 wherein the signal phases of each of the generated plurality of out signals are separated from each other by an equal amount of time.

4. The blender circuit of claim 1 wherein the first and second circuits are each configured to receive a plurality of enable signals, wherein the number of enable signals, the number of first intermediate signals, and the number of second intermediate signals is the same.

5. The blender circuit of claim 1 wherein first, second and third circuits each include a plurality of NAND gates, wherein each NAND gate of the first circuit has a corresponding NAND gate in the second circuit, and wherein the first and second intermediate signals generated by corresponding NAND gates of the first and second circuits are received by a corresponding NAND gate of the third circuit.

6. The blender circuit of claim 5 wherein at least some of the NAND gates of the second circuit are configured with a capacitor on their outputs such that at least some of the plurality of second intermediate signals are further delayed.

7. The blender circuit of claim 5 wherein there is a single NAND gate in the first circuit that corresponds with a single NAND gates of the second circuit and a single NAND gate of the third circuit.

8. A blender circuit configured to receive a first signal having a first signal phase and a second signal having a second signal phase, wherein the first and second signals have a similar frequency and the first and second signal phases are separated by a time delay, the blender circuit comprising:
   a first set of logic gates each configured to receive the first signal and an enable signal, each logic gate generating a first intermediate signal that is independent of the time delay between the first and second signals;
   a second set of logic gates each configured to receive the second signal and an enable signal, each logic gate generating a second intermediate signal that is independent of the time delay between the first and second signals; and a third set of logic gates each configured to receive one first intermediate signal and one second intermediate signal, each output logic gate generating an output signal;

wherein each output signal have a different signal phase that is spaced in time relative to each of the other signal phases, wherein each signal phase of the output signals falls within the time delay, and wherein the number of output signals generated within the time delay varies dependant upon the length of the time delay.

9. The blender circuit of claim 8 wherein the first signal is an early signal, the second signal is a late signal, and the difference between the first and second signal phases is a coarse delay.

10. The blender circuit of claim 8 wherein the signal phases of each of the generated plurality of out signals are separated from each other by an equal amount of time.

11. The blender circuit of claim 8 wherein the logic gates are all NAND gates, wherein each NAND gate of the first circuit has a corresponding NAND gate in the second circuit, and wherein the first and second intermediate signals generated by corresponding NAND gates of the first and second circuits are received by a corresponding NAND gate of the third circuit.

12. The blender circuit of claim 11 wherein number of NAND gates in the first, second and third circuits, and the number of out signals generated and all the same.

13. The blender circuit of claim 11 wherein at least some of the NAND gates of the second circuit are configured with a capacitor on their outputs such that at least some of the plurality of second intermediate signals are further delayed.

14. The blender circuit of claim 8 wherein the logic gates are all NAND gates, wherein there are a plurality of NAND gates of the first circuit for each enable signal that correspond to a equal number of NAND gates in the second circuit for that enable signal.

15. A method of blending a first signal and a second signal with phases that are separated by a time delay, the method comprising:

generating a plurality of first intermediate signals, which are independent of the time delay, from the first signal and from a plurality of enable signals;

generating a plurality of second intermediate signals, which are independent of the time delay, from the second signal and from a plurality of enable signals; and generate a plurality of out signals from the first plurality and second plurality of intermediate signals;

wherein each of the plurality of out signals have different signal phases that are spaced in time relative to each other, wherein each signal phase of the plurality of out signals falls within the time delay, and wherein the number of out signals generated within the time delay varies dependant upon the length of the time delay.

16. The method of claim 15 wherein the first signal is an early signal, the second signal is a late signal, and the difference between the first and second signal phases is a coarse delay.

17. The method of claim 15 wherein the signal phases of each of the generated plurality of out signals are separated from each other by an equal amount of time.

18. The method of claim 15 wherein generating the plurality of first and second intermediate signals includes a logic NAND operation of an enable signal and the first and second signals.

19. The method of claim 15 further including delaying certain of the plurality of the second intermediate signals by incremental amounts.

20. The method of claim 19 wherein delaying certain of the plurality of the second intermediate signals includes using a capacitor.

* * * * *